(12) United States Patent
O'Grady

(10) Patent No.: US 7,385,171 B2
(45) Date of Patent: Jun. 10, 2008

(54) METHOD AND APPARATUS FOR PROVIDING ENHANCED RESOLUTION IN PHOTODETECTORS

(75) Inventor: Matthew T. O'Grady, Phoenixville, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 75 days.

(21) Appl. No.: 11/125,305

(22) Filed: May 9, 2005

(65) Prior Publication Data

US 2006/0249658 A1    Nov. 9, 2006

(51) Int. Cl.
G01J 1/44       (2006.01)
H03F 3/08       (2006.01)
H01J 40/14      (2006.01)

(52) U.S. Cl. ................ 250/214 R; 250/208.1; 348/297

(58) Field of Classification Search ........... 250/214 R, 250/214.1; 345/613, 614, 616; 382/194, 382/268; 348/294, 297, 298, 307, 311, 313; 257/218, 290

See application file for complete search history.

(56) References Cited

U.S. PATENT DOCUMENTS 5,471,515 A    11/1995    Fossum et al. ............ 377/60
6,144,366 A *  11/2000    Numazaki et al. ......... 345/156
7,091,466 B2    8/2006    Bock ...................... 250/208.1
2003/0164441 A1*  9/2003    Lyon et al. ............. 250/208.1
2006/0077269 A1    4/2006    Kindt et al. .............. 348/294

OTHER PUBLICATIONS

U.S. Patent Appl No. 11/125,304, entitled "Method and Apparatus for Providing Flexible Photodetector Binning," filed May 9, 2005.
Office Action dated Nov. 20, 2006, from co-pending U.S. Appl. No. 11/125,304.
Notice of Allowance dated Aug. 15, 2007, from co-pending U.S. Appl. No. 11/125,304.

* cited by examiner

*Primary Examiner*—Davienne Monbleau
*Assistant Examiner*—Francis M LeGasse, Jr.
(74) *Attorney, Agent, or Firm*—McCarter & English, LLP

(57) ABSTRACT

A method and apparatus for providing enhanced resolution in photodetector arrays is provided. In a first pass, pixels of a photodetector array are set to low input impedance values, and measurements of each pixel value are taken. In a second pass, selected pixels are set to high input impedance levels and remaining pixels set to low input impedance level, and measurements are taken at The low input impedance pixels. In a third pass, input impedance levels are reversed, and measurements are taken at the low input impedance pixels. A sequence of mathematical calculations are then performed on the measurements taken in the first, second, and third passes to produce half-pixel values for each of the pixels of the array, thereby doubling the resolution of the array without requiring additional circuitry or modification thereto.

21 Claims, 5 Drawing Sheets

Pass 1 = {A, B, C, D, E, F, G, H}

Pass 2 = { $S_1 = A + B_L$
$S_2 = B_R + C + D_L$
$S_3 = D_R + E + F_L$
$S_4 = F_R + G + H_L$ }

$S_1 - A = A + B_L - A = B_L$
$B - B_L = B_R$ $S_2 - C - B_R = B_R + C + D_L - C - B_R = D_L$
$D - D_L = D_R$ $S_3 - E - D_R = D_R + E + F_L - E - D_R = F_L$
$F - F_L = F_R$ $S_4 - G - F_R = F_R + G + H_L - G - F_R = H_L$
$H - H_L = H_R$ $S_8 - H = H + G_R - H = G_R$
$G - G_R = G_L$ $S_7 - F - G_L = E_R + F + G_L - F - G_L = E_R$
$E - E_R = E_L$ $S_6 - D - E_L = C_R + D + E_L - D - E_L = C_R$
$C - C_R = C_L$ $S_5 - B - C_L = A_R + B + C_L - B - C_L = A_R$
$A - A_R = A_L$

METHOD AND APPARATUS FOR PROVIDING ENHANCED RESOLUTION IN PHOTODETECTORS

BACKGROUND OF THE INVENTION

1. Field of the Invention

The present invention relates to a method and apparatus for providing enhanced resolution in photodetectors.

2. Related Art

Photodetectors are critical components in modern optical, imaging, and communications equipment, and improvements in the resolution of such devices are continually sought. The spatial resolution of a photodetector is commonly characterized by the number of pixels provided in the detector and pixel pitch. Typically, increased resolution can be achieved by increasing the number of pixels in a given photodetector, but such an approach increases manufacturing costs and increases the overall size of the detector. As such, there is a tradeoff in the optoelectronic arts between increasing device resolution while curtailing increases in manufacturing costs and detector size.

Pixel miniaturization represents one technique for increasing detector resolution while preserving detector size, but to date, such efforts have been unsatisfactory. For example, in hybrid focal plane arrays (FPAs), a number of factors can limit the ability to miniaturize pixels, including difficulty in scaling circuitry of a given topology using available process technologies, inability to efficiently and accurately deposit indium bumps and hybridize the detector array to a readout integrated circuit (including difficulties with other die-to-die interconnection schemes), difficulty in implementing closely-spaced pixels within an array, and decreased manufacturing yield as design and manufacturing limits are approached. Further, when pixels are miniaturized, imaging difficulties arise in environments with low light levels. This can be attributed to fewer photons being detected because of a decrease in the collection area at the pixel level, as well as smaller integration capacitor size attributable to smaller pixel size.

Other techniques for increasing photodetector resolution include post-sensor processing of either controlled sub-pixel motion or sub-pixel information gleaned from frame sequences in videos. As can be readily appreciated, such techniques are inefficient because they require motion of either the scene or the detector array to achieve higher resolutions, and such motion may be undesirable and/or impractical in many applications. Further, the use of post-sensor signal processing increases overall manufacturing costs, as well as the size and power dissipation of the system. Thus, each of the aforementioned techniques require modification to existing photodetector designs, and are costly to implement.

Accordingly, what would be desirable, but has not yet been provided, is a method and apparatus for providing enhanced resolution in any suitable photodetector that does not require scene or detector motion, and which can be implemented without modification to any desired photodetector array.

SUMMARY OF THE INVENTION

The present invention provides a method and apparatus for increasing resolution in photodetector arrays. The method can be practiced using any suitable photodetector without requiring modification thereto, and comprises the steps of setting all pixels in the photodetector array to a low input impedance level; measuring a first set of signals from the pixels in a first pass; setting selected pixels in the photodetector array to a high input impedance level and remaining pixels to a low input impedance level; measuring a second set of signals from low input impedance pixels in a second pass; and calculating partial pixel values for pixels in the array using the first set of signals and the second set of signals, the partial pixel values corresponding to light received by portions of pixels of the array. Additionally, the method comprises the steps of alternating input impedance levels of pixels in the photodetector array (e.g., low input impedance pixels set to high input impedance, and high input impedance pixels set to low input impedance); measuring a third set of signals from low input impedance pixels in a third pass; and calculating partial pixel values for pixels in the array using the first set of signals and the third set of signals, the partial pixel values corresponding to light received by portions of the remaining pixels of the array. The method doubles the resolution of the array without requiring additional circuitry or modification thereto.

The present invention also provides a method for increasing resolution in a two-dimensional photodetector array, comprising the steps of establishing a horizontal bin area in the array; measuring pixel intensities in horizontal bin area; determining a first set of half-pixel values from measurements taken from the horizontal bin area; establishing a vertical bin area in the array; measuring pixel intensities in a vertical bin area; determining a second set of half-pixel values from measurements taken from the vertical bin area; and calculating partial pixel values for pixels in the array using the first set of half-pixel values and the second set of half-pixel values. The method can be applied to determine half-, quarter-, and eighth-pixel values for pixels in the array, thereby providing two-fold, four-fold, and eight-fold increases in resolution of the array, without requiring additional circuitry or modification thereto.

The present invention also provides an apparatus for increasing resolution in a photodetector array. The apparatus includes a photodetector; means for individually controlling input impedance levels of pixels in the photodetector; means for scanning detector areas within the photodetector; and means for calculating partial pixel values using outputs from the means for scanning detector areas. The photodetector could be a charge coupled device (CCD), active pixel sensor (APS), focal plane array (FPA), a CMOS imager, or any other suitable detector.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

The present invention relates to a method and apparatus for providing enhanced resolution in photodetector arrays. Any suitable photodetector array, such as a charged coupled device (CCD), a focal plane array (FPA), an active pixel sensor (APS), a CMOS imager, or other detector, is provided. In a first pass, all pixels in the photodetector array are set to a low input impedance level, and measurements are taken from the pixels to produce a first set of signals. Then, in a second pass, selected pixels in the photodetector array are set to a high input impedance level and remaining pixels to a low input impedance level, and measurements are taken from the low input impedance pixels to produce a second set of signals. Partial pixel values are calculated for pixels in the array using the first set of signals and the second set of signals, the partial pixel values corresponding to light received by portions of pixels of the array. In a third pass, input impedance levels of pixels in the photodetector array are alternated (e.g., low input impedance pixels set to high input impedance, and high input impedance pixels set to low input impedance), and a third set of signals are measured from the low input impedance pixels in a third pass. Partial pixel values for remaining pixels in the array are calculated using the first set of signals and the third set of signals, the partial pixel values corresponding to light received by portions of the remaining pixels of the array. The method doubles the resolution of the array without requiring additional circuitry or modification thereto, and can be applied to two-dimensional arrays.

Figure 1A:
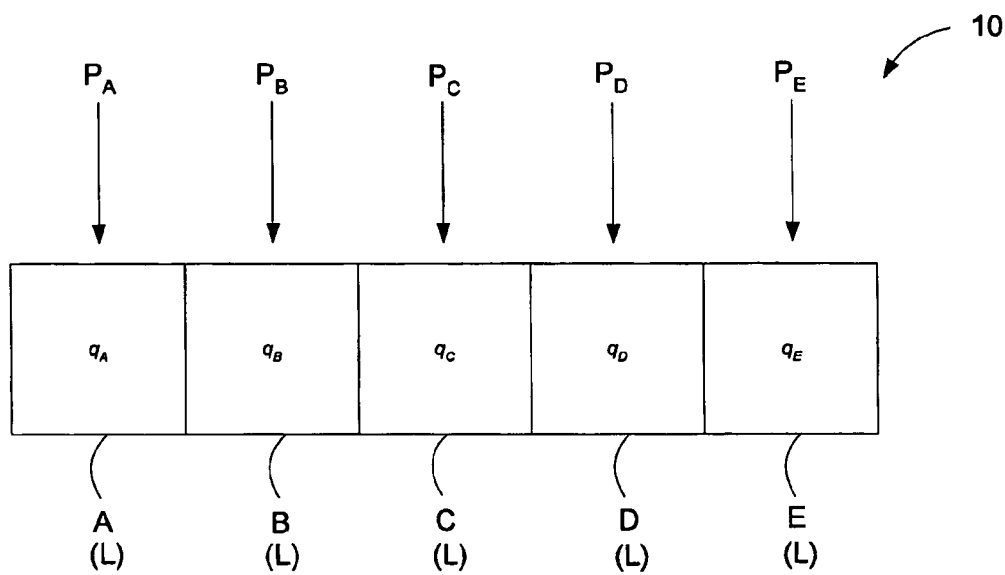
FIGS. 1a and 1b are diagrams showing a method for implementing flexible photodetector binning.
Figure 1B:
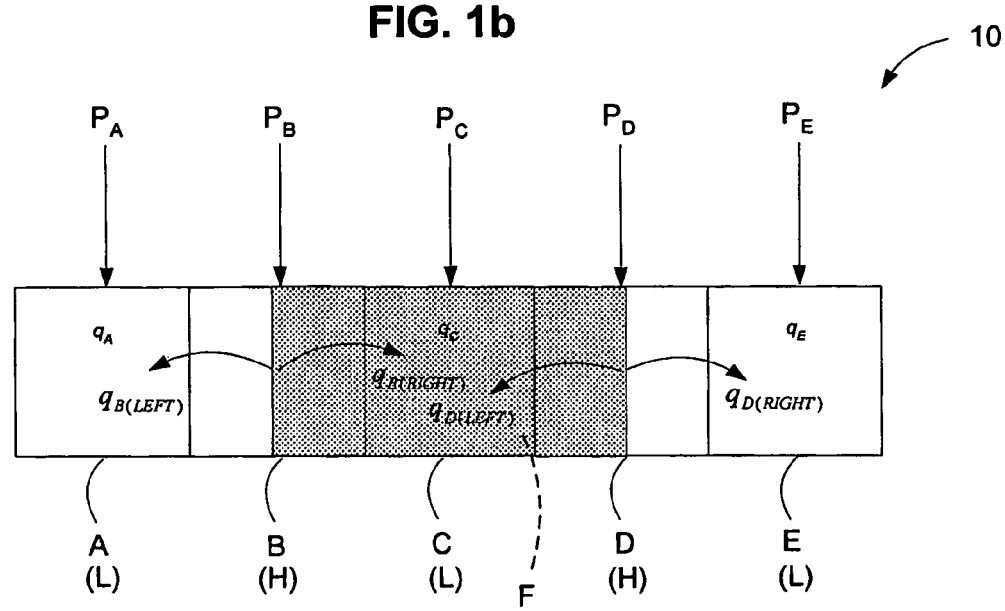

FIGS. 1a and 1b are diagrams showing a method for implementing flexible photodetector binning, which method is utilized by the present invention. This method is described in detail in co-pending U.S. patent application Ser. No. 11/125,304, entitled "Method and Apparatus for Providing Flexible Photodetector Binning" and filed on even date herewith, the entire disclosure of which is expressly incorporated herein by reference. The binning method can be implemented in any suitable photodetector, and allows for flexible bin geometries to be produced across any desired number of pixels, or portions thereof.

FIG. 1a is a diagram showing charges generated in a photodetector array 10, wherein each of the pixels are set to a low input impedance level. Photons $P_A$-$P_E$ detected by each of the pixels A through E generate electrical charges $q_A$ through $q_E$, respectively. In this arrangement, each of the pixels A through E can detect charges generated by photons striking each respective pixel. The low input impedance level could be any desired value, such as from approximately 0 to 500 k ohms. The photodetector 10 could be any suitable detector, such as a charged coupled device (CCD), a focal plane array (FPA), an active pixel sensor (APS), or other detector. Impedance levels of each pixel are preferably individually addressable, but could also be addressed in any other way, such as by column, row, or in a grid pattern.

FIG. 1b is a diagram showing charges generated in the photodetector 10, wherein both high and low input impedance levels are applied to the pixels A through E. Pixels A, C, and E are set to a low input impedance level, which could range from approximately 0 to 500 k ohms, while pixels B and D are set to high impedance level. The high input impedance level is approximately 10 times greater than the low input impedance level, and typically ranges from approximately greater than 500 k ohms to 1 G ohm, but could be even higher.

Charges $q_A$, $q_C$, and $q_E$ generated by photons $P_A$, $P_C$, and $P_E$ intercepted by pixels A, C, and E are collected at each of these pixels, respectively. However, charges $q_B$ and $q_D$ generated by photons $P_B$ and $P_D$ intercepted by pixels B and D, which are set to a high input impedance, are not collected at the pixels B and D. Rather, the charges $q_B$ and $q_D$ migrate to pixels A, C, and E, such that a portion of the charge $q_B$, designated as $q_{B(LEFT)}$ and corresponding to the left-hand side of pixel B, is collected at pixel A and the remaining portion of the charge $q_B$, designated $q_{B(RIGHT)}$ and corresponding to the right-hand side of pixel B, is collected at pixel C. Further, a portion of the charge $q_D$, designated as $q_{D(LEFT)}$ and corresponding to the left-hand side of pixel D, is collected at pixel C and the remaining portion of the charge $q_D$, designated as $q_{D(RIGHT)}$, is collected at pixel E. This results in a bin area or "superpixel" F, which extends partially across pixel B, fully across pixel C, and partially across pixel D. The charges collected at pixel C correspond to photons intercepted by the bin area F. Thus, as can be appreciated, the present invention allows photons to be collected from whole and partial pixel areas. The charges collected by the photodetector 50 can be summarized as follows:

TABLE 1

| Pixel | Impedance | Charge Collected |
|---|---|---|
| A | Low | $q_A + q_{B(LEFT)}$ |
| B | High | 0 |
| C | Low | $q_{B(RIGHT)} + q_C + q_{D(LEFT)}$ |
| D | High | 0 |
| E | Low | $q_E + q_{D(RIGHT)}$ |

As can be seen in Table 1, each of the low input impedance pixels A, C, and E collect charges $q_A$, $q_C$, and $q_E$ corresponding to full pixel areas A, C, and E, in addition to partial pixel areas. The output of pixel A corresponds to light intercepted by a bin that includes pixel A and the left portion of pixel B. The output of pixel C corresponds to light intercepted by a bin that includes the right portion of pixel B, the entire pixel C, and the left portion of pixel D (shown in FIG. 2b as bin F). The output of pixel E corresponds to light intercepted by a bin that includes the right portion of pixel D and all of pixel E.

The response of the low input impedance pixels A, C, and E to charges generated in adjacent high input impedance pixels D and B is a trapezoidal function of the distance of the low input impedance pixels from the high input impedance pixels. The response could also be closely approximated as a rectangular function. It should be noted that the input impedance levels of each of the pixels A through E could be varied to achieve a desired binning geometry, e.g., to produce a bin that extends over any desired number of pixels, or portions thereof. Further, while the binning shown in FIG. 1b is illustrated in a one-dimensional photodetector array, flexible binning can be achieved in two-dimensional arrays. As will be discussed later in greater detail, the flexible binning methodology is utilized by the present invention to increase resolution of the photodetector array.

Advantageously, binning occurs within the photodetector array 10, and not in readout circuitry associated with the array 10. This overcomes limitations of previous binning techniques that are performed in such circuitry, by eliminating noise introduced by such circuits and increasing the signal-to-noise (S/N) ratio of the photodetector. Input impedance levels of each pixel of the photodetector array 10 can be controlled using any suitable technique, and need not require any additional hardware. For example, the input impedance levels can be programmed into and stored individually in each pixel. Further, the levels can be controlled for each pixel based upon logic signals distributed along rows and columns of the array. Additionally, the impedances can be controlled by analog signals distributed along rows and columns of the array, in fixed or random patterns.

The input impedance function can be implemented by varying the bias on input transistors of each pixel of the photodetector array 10, or by setting the reference voltage of a capacitive transimpedance amplifier (CTIA) input, or any other pixel input circuit, so that individual pixels cannot sink current due to limited output signal swing. Alternatively, a separate input transistor can be used at the input of a readout circuit operable with each pixel of the array. Such circuit can be designed to automatically read only those pixels in the array that contain a binned signal present at a low input impedance pixel.

Figure 2:
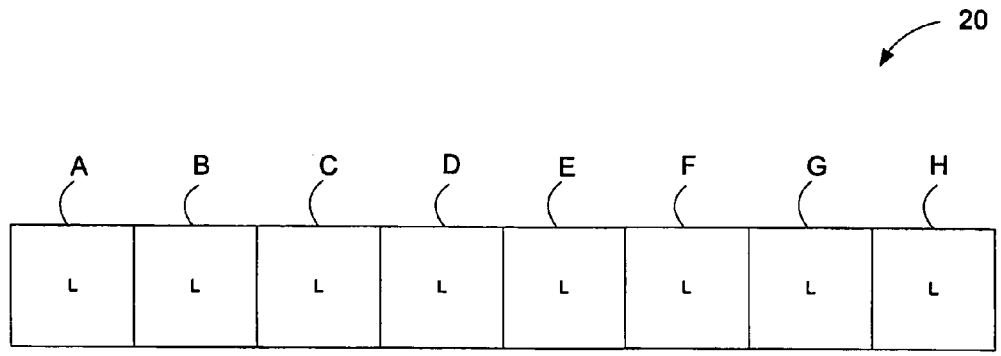
FIG. 2 is a diagram showing a photodetector array according to the present invention, wherein each of the pixels are set to low input impedance and measurements are taken for each pixel in a first pass.

FIG. 2 is a diagram showing a one-dimensional photodetector array 20 according to the present invention, wherein each of the pixels A-H are set to low input impedance and measurements are taken for each pixel in a first pass. Each of the measurements corresponds to photons detected within the individual pixel areas for pixels A-H. It is to be understood that the configuration and pixel arrangement of array 20 is illustrative in nature, and could be altered as desired.

Figure 3:
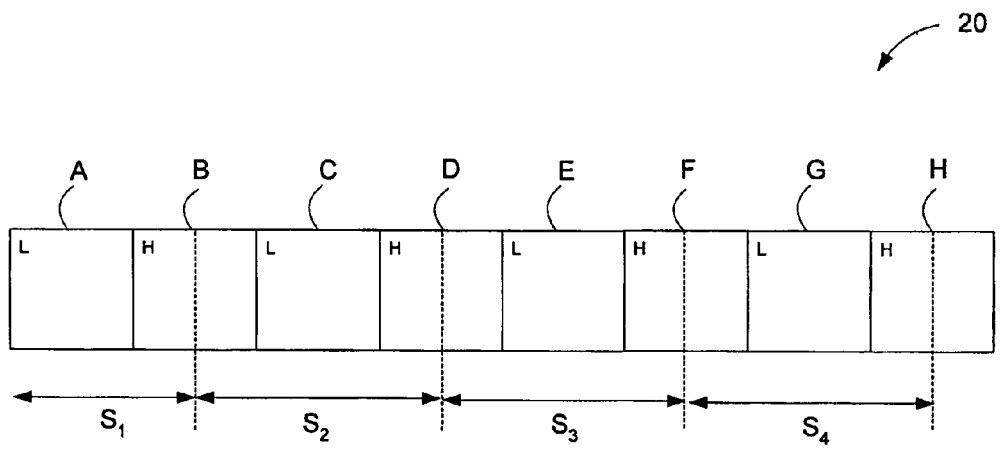
FIG. 3 is a diagram showing the photodetector array of the present invention, wherein alternate pixels of the array are set to high and low input impedance levels and measurements are taken in a second pass.

FIG. 3 is a diagram showing the photodetector array 20 of the present invention, wherein alternate pixels of the array are set to high and low input impedance levels and measurements are taken in a second pass. Pixels A, C, E, and G are set to a low input impedance level, and pixels B, D, F, and H are set to high input impedance. Measurements are then taken at the low input impedance pixels A, C, E, and F, producing signals $S_1$, $S_2$, $S_3$, and $S_4$ corresponding to binned outputs of whole and partial pixels. Specifically, the signal $S_1$ corresponds to a bin area that includes all of pixel A and half of pixel B, and can be expressed as $A+B_L$, where $B_L$ represents photons detected in the left-hand side of pixel B. The signal $S_2$ corresponds to a bin area that includes half of pixel B, all of pixel C, and half of pixel D, and can be expressed as $B_R+C+D_L$ where $B_R$ represents photon detected by the right-hand side of pixel B and $D_L$ represents pixels detected by the left-hand side of pixel D. The signal $S_3$ corresponds to a bin area that includes half of pixel D, all of pixel E, and half of pixel F, and can be expressed as $D_R+E+F_L$. Finally, signal $S_4$ corresponds to a bin area that includes half of pixel F, all of pixel G, and half of pixel H, and can be expressed as $F_R+G+H_L$. As discussed below in greater detail, these measurements are utilized, in conjunction with the measurements taken in the first pass, to calculate half-pixel measurements for pixels of the array 20.

Figure 4:
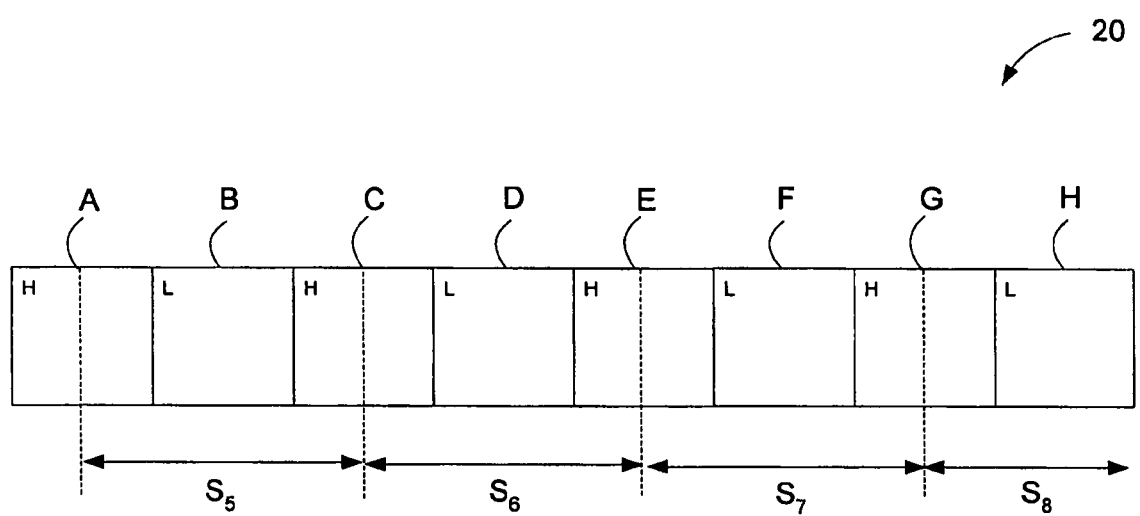
FIG. 4 is a diagram showing the photodetector array of the present invention, wherein input impedance levels of the pixels are reversed and measurements are taken in a third pass.

FIG. 4 is a diagram showing the photodetector array 20 of the present invention, wherein input impedance levels of the pixels are reversed and measurements are taken in a third pass. Specifically, pixels A, C, E, and G are set to a high input impedance level, and pixels B, D, F, and H are set to a low input impedance levels. Measurements are then taken at the low input impedance pixels B, D, F, and H, producing signals $S_5$, $S_6$, $S_7$, and $S_8$ corresponding to binned outputs of whole and partial pixels. The signal $S_5$ corresponds to a bin area that includes half of pixel A, all of pixel B, and half of pixel C, and can be expressed as $A_R+B+C_L$, where $A_R$ represents photons detected in the right-hand side of pixel A and $C_L$ represents photons detected in the left-hand side of pixel C. The signal $S_6$ corresponds to a bin area that includes half of pixel C, all of pixel D, and half of pixel E, and can be expressed as $C_R+D+$ $E_L$. The signal $S_7$ corresponds to a bin area that includes half of pixel E, all of pixel F, and half of pixel G, and can be expressed as $E_R+F+G_L$. Finally, signal $S_8$ corresponds to a bin area that includes half of pixel G and all of pixel H, and can be expressed as $G_R+H$. These measurements are utilized, in conjunction with the measurements taken in the first pass, to calculate half-pixel measurements for remaining pixels of the array 20. It should be noted that the first and second passes described herein need not be taken in a specific sequence, and any sequence of passes could be utilized without departing from the spirit or scope of the present invention.

Figure 5:
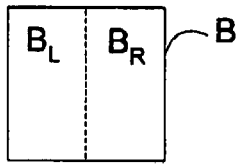
FIG. 5 shows calculations according to the present invention performed on measurements acquired in the passes illustrated in FIGS. 2-4 to produce half-pixel values for pixels of the photodetector array.
Figure 5:
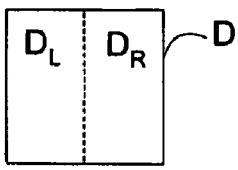
Figure 5:
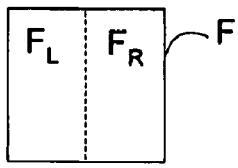
Figure 5:
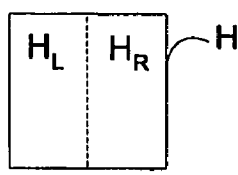
Figure 5:
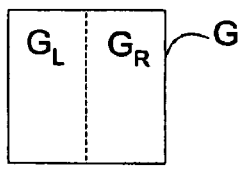
Figure 5:
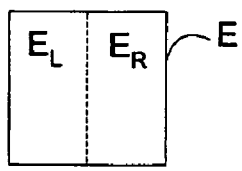
Figure 5:
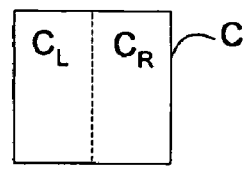
Figure 5:
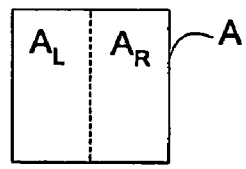

FIG. 5 shows calculations according to the present invention performed on measurements acquired in the passes illustrated in FIGS. 2-4, to produce half-pixel values for pixels of the photodetector array. The calculations shown in FIG. 5 could be carried out in the array itself, by any suitable algorithm implemented as software and/or firmware and executed by a readout integrated circuit hybridized with the photodetector array, or any other desired circuit associated with the array, as well as a computer connected thereto. The calculations are carried out in a sequence, wherein solutions derived for half pixel values of a given pixel are then used to compute half-pixel values of successive pixels. While the sequence shown in FIG. 5 is illustrative in nature, it is to be understood that optimizations thereof could be provided without departing from the spirit or scope of the present invention.

Beginning with pixel B, the half-pixel value $B_L$ can be obtained by subtracting the whole pixel value A obtained in the first pass shown in FIG. 2 from the signal $S_1$ obtained in the second pass shown in FIG. 3. This calculation can be expressed as:

$$S_1 - A = A + B_L - A = B_L \qquad \text{Equation 1}$$

where $B_L$ corresponds to the left-hand value of pixel B. Once this value has been determined, it can then be subtracted from the whole pixel value B to determine the right-hand value $B_R$ of pixel B, as follows:

$$B - B_L = B_R \qquad \text{Equation 2}$$

Thus, the half pixel values for pixel B are computed, thereby resulting in a two-fold increase in the resolution of pixel B. The right-hand pixel value $B_R$ can then be utilized, in conjunction with the signal $S_2$, to determine the half-pixel values for pixel D, as shown below:

$$S_2 - C - B_R = B_R + C + D_L - C - B_R = D_L$$

$$D - D_L = D_R \qquad \text{Equations 3, 4}$$

The half pixel values for pixel F can be determined as follows, using half-pixel value $D_R$ and signal $S_3$:

$$S_3 - E - D_R = D_R + E + F_L - E - D_R = F_L$$

$$F - F_L = F_R \qquad \text{Equations 5, 6}$$

Finally, the half-pixel values for pixel H can be determined as follows, using half-pixel value $F_R$ and signal $S_4$:

$$S_4 - G - F_R = F_R + G + H_L - G - F_R = H_L$$

$$H - H_L = H_R \qquad \text{Equations 7, 8}$$

As can be readily appreciated, Equations 1-8 allow for the calculation of half-pixel values for pixels B, D, F, and H, using data acquired in passes one and two illustrated in FIGS. 2 and 3, respectively. Half-pixel values for the remaining pixels A, C, E, and G can be calculated using data from passes one and three illustrated in FIGS. 2 and 4, respectively.

Beginning with pixel G, the half-pixel value $G_R$ can be obtained by subtracting the whole pixel value H obtained in the first pass shown in FIG. 2 from the signal $S_8$ obtained in the thirds pass shown in FIG. 4. This calculation can be expressed as:

$$S_8 - H = H + G_R - H = G_R \quad \text{Equation 9}$$

where $G_R$ corresponds to the right-hand value of pixel G. Once this value has been determined, it can then be subtracted from the whole pixel value G to determine the left-hand value $G_L$ of pixel G, as follows:

$$G - G_R = G_L \quad \text{Equation 10}$$

Thus, the half pixel values for pixel G are computed, thereby resulting in a two-fold increase in the resolution of pixel G. The left-hand pixel value $G_L$ can then be utilized, in conjunction with the signal $S_7$, to determine the half-pixel values for pixel E, as shown below:

$$S_7 - F - G_L = E_R + F + G_L - F - G_L = E_R$$

$$E - E_R = E_L \quad \text{Equations 11, 12}$$

The half pixel values for pixel C can be determined as follows, using half-pixel value $E_L$ and signal $S_6$:

$$S_6 - D - E_L = C_R + D + E_L - D - E_L = C_R$$

$$C - C_R = C_L \quad \text{Equations 13, 14}$$

Finally, the half-pixel values for pixel A can be determined as follows, using half-pixel value $C_L$ and signal $S_5$:

$$S_5 - B - C_L = A_R + B + C_L - B - C_L = A_R$$

$$A - A_R = A_L \quad \text{Equations 15, 16}$$

Thus, the half-pixel values of pixels A, C, E, and G are calculated by Equations 9-16. The equations shown in FIG. 5 allow for the calculation of half-pixel values for each of the pixels A-H of the photodetector 20 of the present invention, thereby resulting in a two-fold increase in the resolution of the photodetector without requiring the addition of any hardware or modification to the photodetector. It should be noted that a dummy pixel having a low input impedance value can be provided on either side of the array 20, to assist with calculations of half-pixel values. Such an arrangement does not increase the array size, as dummy pixels are commonly employed in existing designs.

As mentioned earlier, the calculation sequence described herein can be altered and/or optimized to calculate half-pixel resolutions using fewer computation steps. For example, every third pixel can be set to a high input impedance, and three subpixel measurements taken in each pass. Measurements in such an arrangement would correspond to signals incident to pixel areas $A+B_L$, $C+B_R$, $D+E_L$, $F+E_R$, etc., in one pass and $B+A_R$, $C+D_L$, $E+D_R$, $F+G_L$, etc., in a second pass. Additionally, the calculations can be expanded for two-dimensional arrays, as will be discussed with reference to FIG. 6.

Figure 6:
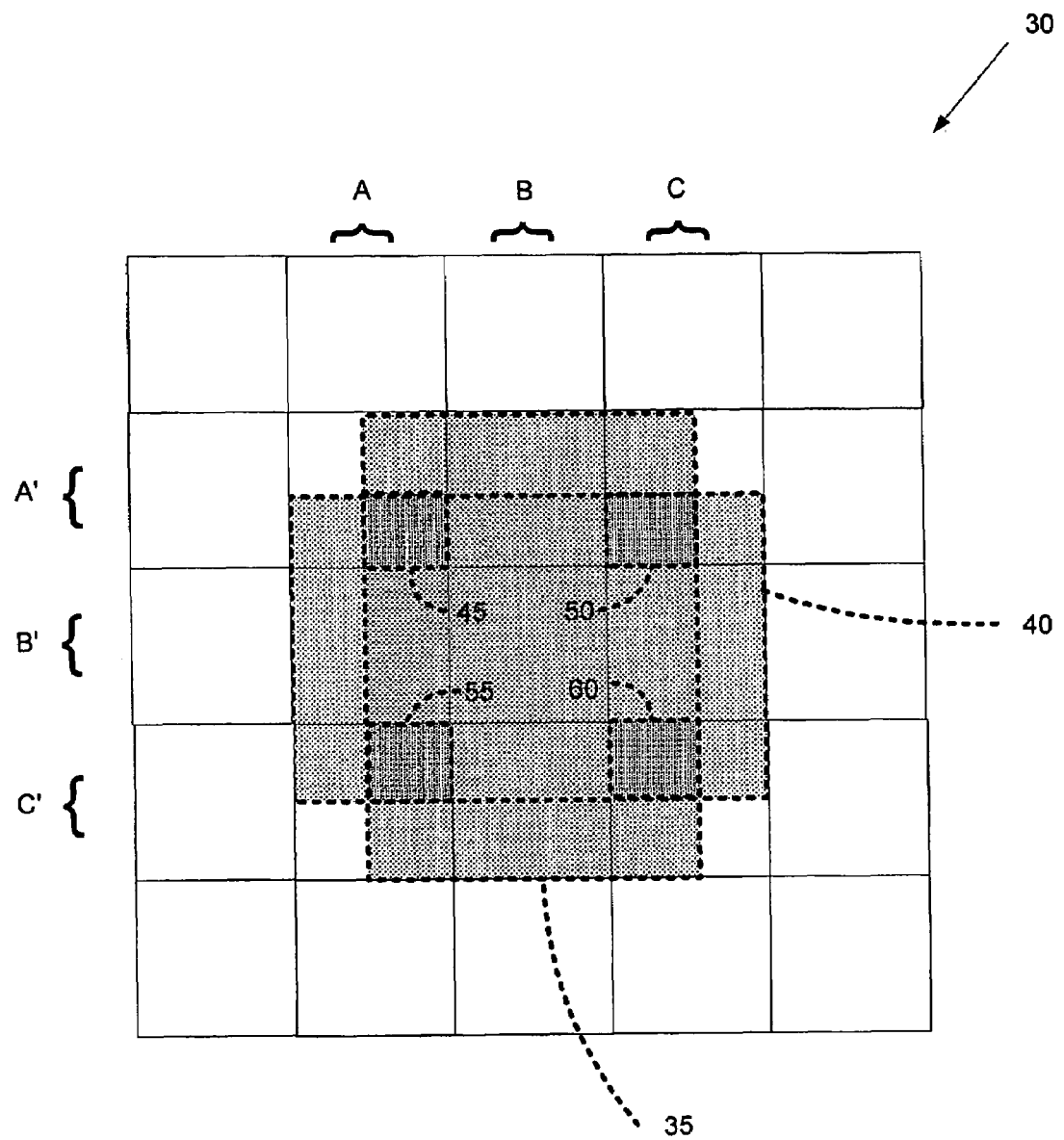
FIG. 6 is a diagram showing a two-dimensional photodetector array according to the present invention, wherein quarter-pixel values are determined.

FIG. 6 is a diagram showing a two-dimensional photodetector array 30 according to the present invention, wherein quarter-pixel values are determined. In a first pass, all of the pixels of the array 30 are set to a low input impedance, and measurements taken to determine whole pixel values. Then, in a second pass, pixels in columns A and C are set to high input impedance, and pixels in column B are set to low input impedance, and measurements taken at each of the low input impedance pixels. A bin area 35 is created, extending partially over pixels in column A, over pixels in column B, and partially over pixels in column C. The measurements taken are then subtracted from the whole pixel values taken in the first pass, so that half pixel values are determined for pixels in columns A and C. Thereafter, pixels in rows A' and C' are set to high input impedance, and pixels in row A' B' are set to low input impedance. Measurements are then taken at each of the low input impedance pixels, resulting in a bin area 40, extending partially over pixels in row A', over pixels in row B', and partially over pixels in row C'. The measurements taken are then subtracted from the whole pixel values taken in the first pass, so that half pixel values are determined for pixels in rows A' and C'. Quarter-pixel values corresponding to light intercepted in areas 45, 50, 55, and 60 can then be obtained by subtracting the values from the measurements taken in the second pass from the measurements taken in the first pass, thus providing quarter-pixel resolution.

Further alternate arrangements include gathering charges in a checkerboard pattern in a two-dimensional array, to produce pixel areas that are diamond-like in shape. Such an arrangement also produces a four-fold increase in resolution. The diamond-like and quarter-pixel areas can be reshaped by supplying neighboring pixels with a low input impedance input, or combined to produce an eight-fold increase in resolution.

Having thus described the invention in detail, it is to be understood that the foregoing description is not intended to limit the spirit and scope thereof. What is desired to be protected by Letters Patent is set forth in the appended claims.

What is claimed is:

1. A method for increasing resolution in a photodetector array comprising:
    setting all pixels in the photodetector array to a low input impedance level;
    measuring a first set of signals from the pixels in a first pass;
    setting selected pixels in the photodetector array to a high input impedance level and remaining pixels to a low input impedance level;
    measuring a second set of signals from low input impedance pixels in a second pass; and
    calculating partial pixel values for pixels in the array using the first set of signals and the second set of signals, the partial pixel values corresponding to light received by portions of pixels of the array.

2. The method of claim 1, wherein the partial pixel values comprise half-pixel values corresponding to light received by half of a pixel area.

3. The method of claim 1, further comprising:
    setting a second set of pixels in the photodetector array to a low input impedance level and remaining pixels to a high input impedance level;
    measuring a third set of signals from low input impedance pixels in a third pass; and
    calculating partial pixel values for remaining pixels in the array using the first set of signals and the third set of signals, the partial pixel values corresponding to light received by portions of the remaining pixels of the array.

4. The method of claim 3, wherein the partial pixel values comprise half-pixel values corresponding to light received by half of a pixel area.

5. The method of claim 1, wherein the step of setting selected pixels to a low input impedance level comprises setting alternating pixels in the array to high and low input impedance levels.

6. The method of claim 1, wherein the step of setting selected pixels to a low input impedance level comprises setting every third pixel in the array to a low input impedance level.

7. An apparatus for increasing resolution of a photodetector comprising:
a photodetector;
means for individually controlling the input impedance levels of pixels in the photodetector;
means for scanning detector areas within the photodetector; and
means for calculating partial pixel values using first and second outputs from the means for scanning detector areas generated by first and second measurement passes of the photodetector.

8. The apparatus of claim 7, wherein the photodetector comprises a charge coupled device (CCD) photodetector.

9. The apparatus of claim 7, wherein the photodetector comprises a focal plane array (FPA).

10. The apparatus of claim 7, wherein the photodetector comprises an active pixel sensor (APS).

11. The apparatus of claim 7, wherein the photodetector comprises a CMOS imager.

12. The apparatus of claim 7, wherein the means for individually controlling input impedance levels comprises a plurality of transistors connected to pixels of the photodetector array.

13. The apparatus of claim 7, wherein the means for individually controlling input impedance levels comprises a plurality of control signals delivered to pixels in the photodetector array.

14. The apparatus of claim 7, wherein the means for individually controlling input impedance levels sets all pixels in the array to a low input impedance level in a first pass.

15. The apparatus of claim 14, wherein the means for scanning detector areas scans outputs of each pixel in the array to produce a first set of signals.

16. The apparatus of claim 15, wherein the means for individually controlling input impedance levels sets selected pixels in the array to a low input impedance level and remaining pixels to a high input impedance level in a second pass.

17. The apparatus of claim 16, wherein the means for scanning the detector areas scans outputs from the selected pixels to produce a second set of signals.

18. The apparatus of claim 17, wherein the means for calculating partial pixel values subtracts the first set of signals from the second set of signals to produce the partial pixel values.

19. The apparatus of claim 18, wherein the means for individually controlling input impedance levels sets alternate pixels in the array to a low input impedance level and remaining pixels to a high input impedance level in a third pass.

20. The apparatus of claim 19, wherein the means for scanning the detector areas scans outputs from the alternate pixels to produce a third set of signals.

21. The apparatus of claim 20, wherein the means for calculating partial pixel values subtracts the first set of signals from the third set of signals to produce partial pixel values for remaining pixels in the array.

* * * * *